United States Patent
Sakai

(10) Patent No.: US 6,488,795 B1
(45) Date of Patent: Dec. 3, 2002

(54) MULTILAYERED CERAMIC SUBSTRATE AND METHOD OF PRODUCING THE SAME

(75) Inventor: Norio Sakai, Moriyama (JP)

(73) Assignee: Murata Manufacturing Co. Ltd (JP)

( * ) Notice: Subject to any disclaimer, the term of this patent is extended or adjusted under 35 U.S.C. 154(b) by 115 days.

(21) Appl. No.: 09/654,724

(22) Filed: Sep. 5, 2000

(30) Foreign Application Priority Data

Oct. 27, 1999 (JP) .......................................... 11-305011

(51) Int. Cl.[7] .......................... H05K 3/46; H01B 19/00; H01L 23/12
(52) U.S. Cl. ............................ 156/89.17; 156/89.12; 156/89.16; 156/89.18; 29/851; 428/210; 428/901
(58) Field of Search ........................ 156/89.12, 89.16, 156/89.17, 89.18, 267; 264/614, 618, 619; 29/851; 428/210, 901

(56) References Cited

U.S. PATENT DOCUMENTS

| | | | | |
|---|---|---|---|---|
| 4,879,156 A | * | 11/1989 | Herron et al. | |
| 5,130,067 A | * | 7/1992 | Flaitz et al. | |
| 5,370,759 A | * | 12/1994 | Hakotani et al. | |
| 5,456,778 A | * | 10/1995 | Fukuta et al. | |
| 5,470,412 A | * | 11/1995 | Fukuta et al. | |
| 5,814,366 A | * | 9/1998 | Fukuta et al. | 156/89.11 |
| 5,855,711 A | * | 1/1999 | Araki et al. | 156/89.16 |
| 6,042,667 A | * | 3/2000 | Adachi et al. | 156/89.12 |
| 6,139,666 A | * | 10/2000 | Fasano et al. | 156/89.16 X |
| 6,153,290 A | * | 11/2000 | Sunahara | |
| 6,228,196 B1 | * | 5/2001 | Sakamoto et al. | 156/89.17 |
| 6,241,838 B1 | * | 6/2001 | Sakamoto et al. | 156/89.17 |

FOREIGN PATENT DOCUMENTS

| | | | |
|---|---|---|---|
| RD | 302056 | * | 6/1989 |
| JP | 61-78639 | * | 4/1986 |
| JP | 5-7063 | * | 1/1993 |
| JP | 5-191047 | * | 7/1993 |
| JP | 11-224984 | * | 8/1999 |

OTHER PUBLICATIONS

"High Density MLC Structure," IBM Technical Disclosure Bulletin, Sep. 1, 1989, vol. 32, Issue 4B, p. 354.*

* cited by examiner

Primary Examiner—Curtis Mayes
(74) Attorney, Agent, or Firm—Dickstein, Shapiro, Morin & Oshinsky, LLP

(57) ABSTRACT

A method of producing a multilayered ceramic substrate in which wiring conductors can be provided on both main surfaces and the density of the wiring conductors can be increased by a non-shrinkage process. In the producing method, a green composite laminated product in which metallic foils are arranged to cover both main surfaces of a green laminated structure comprising a plurality of ceramic green sheets on which conductive paste is coated for forming internal wiring conductors is burned. In this burning step, shrinkage of the ceramic green sheets is suppressed by the metallic foils in the direction of the main surfaces thereof. After burning, the metallic foils are patterned by etching based on photolithographic technology to form external conductor films.

18 Claims, 2 Drawing Sheets

MULTILAYERED CERAMIC SUBSTRATE AND METHOD OF PRODUCING THE SAME

BACKGROUND OF THE INVENTION

1. Field of the Invention

The present invention relates to a multilayered ceramic substrate and a method of producing the same. Particularly, a method of producing a multilayered ceramic substrate comprising wiring conductors provided on both main surfaces thereof, and a multilayered ceramic substrate obtained by the producing method.

2. Description of the Related Art

A multilayered ceramic substrate comprises a plurality of laminated ceramic layers. Such a multilayered ceramic substrate also comprises various forms of wiring conductors. As the wiring conductors, for example, an internal conductor film formed in the multilayered ceramic substrate so as to extend in a planar form along a specified interface between the ceramic layers, a via hole conductor is formed to pass through a specified ceramic layer, or an external conductor film is formed to extend in a planar form on the outer surface of the multilayered ceramic substrate.

The internal conductor film or the via hole is partially used for forming a passive part, for example, such as a capacitor element, an inductor element, or the like, in some cases. The external conductor film is used for mounting other chip-shaped electronic parts, and for mounting the multilayered ceramic substrate on a mother board.

In order to further improve multi-functionality, density and performance of the multilayered ceramic substrate, it is effective to arrange the wiring conductors with a high density on the multilayered ceramic substrate. However, a burning step is necessary for obtaining the multilayered ceramic substrate, and the burning step causes shrinkage due to sintering of ceramic. Such shrinkage non-uniformly occurs over the whole of the multilayered substrate, and thus undesired deformation or distortion occurs in the wiring conductors. Such deformation or distortion of the wiring conductors inhibits an increase in the density of the wiring conductors.

Therefore, in producing the multilayered ceramic substrate, it is proposed to apply a so-called non-shrinkage process which is capable of substantially preventing the occurrence of shrinkage in the direction of a main surface of the multilayered ceramic substrate in the burning step.

A method of producing a multilayered ceramic substrate by the non-shrinkage process, which is interesting to the present invention, is disclosed in, for example, U.S. patent application Ser. No. 2,785,544 or Japanese Examined Patent Publication No. 7-46540.

In this technique, dummy green sheets comprising a high-temperature sintered ceramic material such as alumina or the like, which does not sinter at a sintering temperature of low-temperature sintered ceramic materials, are arranged on the upper and lower main surfaces of a laminated structure comprising a plurality of substrate green sheets containing a low-temperature sintered ceramic material, and conductive paste coated for forming internal wiring conductors in connection with the substrate green sheets, the structure is pressed, and then burned at relatively low temperature, and then the unsintered layers derived from the dummy green sheets are removed.

In the burning step, the high-temperature sintered ceramic material is not sintered, and thus substantially no shrinkage occurs in the dummy green sheets, suppressing shrinkage in the direction of the main surfaces of the laminated structure comprising the substrate green sheets due to the force of constraint exerted by the dummy green sheets. Therefore, the laminated structure substantially shrinks only in the direction of the thickness. Less non-uniform deformation occurs in the laminated structure after burning, and thus undesired deformation or distortion of the internal wiring conductors can be prevented.

However, the above-described technique has the following problems to be solved.

First, the high-temperature sintered ceramic material contained in the dummy green sheets is not sintered in the burning step, but mutual diffusion and reaction more or less occurs between the material contained in the dummy green sheets and the material contained in the substrate green sheets in the interfaces between the dummy green sheets and the substrate green sheets, to cause change and deterioration in characteristics of the resultant multilayered ceramic substrate. Particularly, the occurrence of reaction causes difficulties in removing the unsintered layers derived from the dummy green sheets. Therefore, the material which can be used as each of the dummy green sheets and the substrate green sheets is limited.

Also, a sand blasting method, a brushing method using water or a polishing method is used for removing the unsintered layers derived from the dummy green sheets. Therefore, where an external conductor film is desired to be formed on at least one of the main surfaces of the multilayered ceramic substrate, the external conductor film cannot be formed in the stage of the unburned laminated structure. As a result, the external conductor film must be formed on the laminated structure after the unsintered layers are removed after the burning step, thereby causing the need for another step of forming the external conductor film.

Furthermore, the external conductor film must be formed on the laminated structure after burning, and in a case in which a via hole conductor to be connected to the external conductor film is present, there is thus the possibility of causing a failure in conduction between the external conductor film and the via hole conductor.

In producing the multilayered ceramic substrate, the multilayered ceramic substrate is not handled singly, but is handled in the form of an assembly, which is later cut into a plurality of multilayered ceramic substrates. The assembly has the dimensions of as large as a 10 to 20 cm square, and thus warping or waviness occurs on the whole in some cases. Where the external conductor film is formed by, for example, screen printing, the occurrence of such warping or waviness causes difficulties in obtaining high precision of the pattern and position of the external conductor film.

Furthermore, although the above-described method comprises the non-shrinkage process, shrinkage still occurs to some extent, and thus dimensional precision must have an allowance of about ±0.1%. Therefore, with respect to the wiring conductors, consideration must be given to such an allowance, thereby inhibiting an increase in density.

SUMMARY OF THE INVENTION

One preferred embodiment of the present invention provides a method of producing a multilayered ceramic substrate comprising: preparing a green composite laminated product comprising a plurality of ceramic green sheets to be laminated, conductive paste for forming internal wiring conductors in association with the ceramic green sheets, and metallic foils arranged to cover both main surfaces of a green laminated structure comprising the plurality of ceramic green sheets and to hold the green laminated structure therebetween in the direction of lamination; burning the green composite laminated product at a temperature lower than the melting point of the metal which constitutes the metallic foils, while suppressing shrinkage by the metallic foils in the direction parallel to the main surfaces; and pattering the metallic foils by etching based on a photolithographic technology after the burning step.

In the above described method, each of the ceramic green sheets may comprise a low-temperature sintered ceramic material which can be sintered at a temperature of about 1000° C. or less, the conductive paste may comprise a conductive component containing copper or silver as a main component, and the burning step is preferably performed at a temperature of about 1000° C. or less.

In the above described method, each of the metallic foils may comprise a copper foil.

In the above described method, the internal wiring conductors formed by the conductive paste may comprise via hole conductors provided to pass through at least one of ceramic green sheets and contact the metallic foils.

In the above described method, the surfaces of the metallic foils which face the green laminated structure may be roughened.

In the above described method, an organic binder and/or glass paste may be provided between at least one of the metallic foils and the green laminated structure.

Another preferred embodiment of the present invention provides a multilayered ceramic substrate obtained by the above described producing method.

In the above described method, shrinkage of ceramic green sheets in the direction parallel to the main surfaces in the burning step can be suppressed by metallic foils, thereby facilitating an increase in density of internal wiring conductors formed in the multilayered ceramic substrate. In addition, the metallic foils are arranged to cover both main surfaces of a green laminated structure comprising a plurality of ceramic green sheets, and to hold the green laminated structure therebetween in the direction of lamination, thereby permitting the formation of external conductor films along both main surfaces of the multilayered ceramic substrate by using the metallic foils.

Furthermore, the metallic foils are patterned by etching based on the photolithographic technology in order to form the external conductor films, thereby easily permitting the formation of the fine external conductor films and the achievement of a higher density. Unlike the prior art method, there is no need to form the external conductor films after the unsintered layers derived from dummy green sheets are removed after burning, thereby decreasing the number of the steps for forming the external conductor films.

The above described method uses the photolithographic technology for forming the external conductor films from the metallic foils, and thus distortion can be corrected by partial exposure, not full exposure. From this viewpoint, the external conductor films can be made further fine, and the density can be further increased.

The above described method does not employ the shrinkage suppressing effect of dummy green sheets, and thus does not have the problem of causing undesired mutual diffusion and reaction between the dummy green sheets and substrate green sheets. Therefore, the ceramic material used for the substrate green sheets can be selected from a wide range.

In the above described method, a conductive paste is provided for forming internal wiring conductors in the stage of a green composite laminated product, and the conductive paste is brought into contact with the metallic foils at necessary positions. In this state, the burning step is performed to prevent the occurrence of a failure in connection in the internal wiring conductors, and between the internal wiring conductors and the metallic foils.

In the above described method, a ceramic green sheet comprises a low-temperature sintered ceramic material which can be sintered at a temperature of about 1000° C. or less so that the conductive component contained in conductive pate containing copper or silver as a main component can be used without causing a problem in the burning step at a temperature of about 1000° C. or less, thereby realizing the internal wiring conductors with low resistance. Therefore, the resultant multilayered ceramic substrate has good radio-frequency characteristics.

In the above described method, the use of a copper foil as each of the metallic foils permits the formation of external conductor films having low resistance. Since copper has a little problem of migration, the external conductor films can easily be made fine, and the density thereof can easily be increased.

In the above described method, the surfaces of the metallic foils which face the green laminated structure are roughened, or an organic binder and/or glass paste is coated between each of the metallic foils and the green laminated structure so that the adhesive strength between the metallic foils, i.e., the external conductor films, and the laminated structure in the resultant multilayered ceramic substrate can be increased.

Other features and advantages of the present invention will become apparent from the following description of the invention which refers to the accompanying drawings.

DESCRIPTION OF THE PREFERRED EMBODIMENTS

FIGS. 1A to 1G are schematic sectional views successively showing some steps of the method of producing a multilayered ceramic substrate in accordance with an embodiment of the present invention. FIG. 2 is a perspective view showing the appearance of a multilayered ceramic substrate 1 obtained by the producing method shown in FIGS. 1A to 1G.

Referring to FIG. 2, the multilayered ceramic substrate 1 comprises a laminated structure 2 having a structure in which a plurality of ceramic layers are laminated. The laminated structure 2 contains internal wiring conductors (not shown) formed therein. As the internal wiring conductors, an internal conductor film is formed to extend in a planar form along a predetermined interface between ceramic layers, or a via hole conductor is formed to extend to pass through a specified ceramic layer.

As shown in FIG. 2, a patterned external conductor film 3 is formed on the main surface of the laminated structure 2, which faces upward in this figure. Although not shown in FIG. 2, a patterned external conductor film 4 (refer to FIG. 1G) is formed on the main surface of the laminated structure 2 which faces downward.

In order to produce the multilayered ceramic substrate 1, the steps shown in FIGS. 1A to 1G are successively carried out.

Figure 1A:
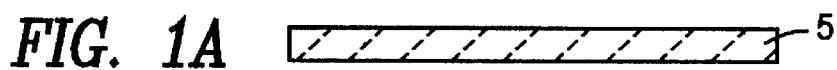
FIGS. 1A, 1B, 1C, 1D, 1E, 1F and 1G are schematic sectional views successively showing some steps of a method of producing a multilayered ceramic substrate in accordance with an embodiment of the present invention.
Figure 2:
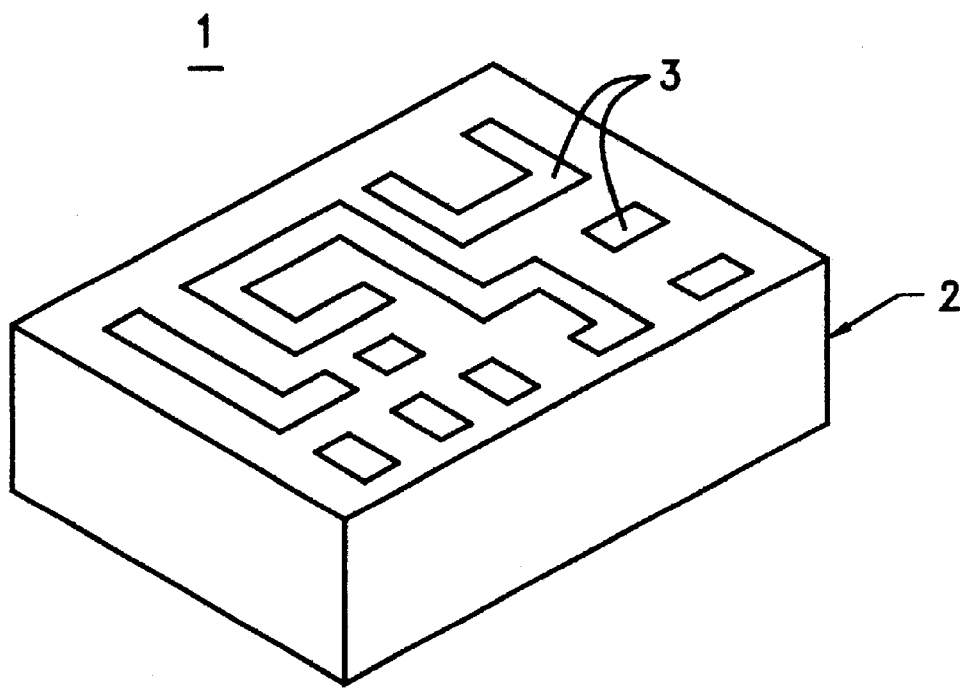
FIG. 2 is a perspective view showing the appearance of a multilayered ceramic substrate obtained by the producing method shown in FIGS. 1A to 1G.

As shown in FIG. 1A, a ceramic green sheet 5 is first prepared. The ceramic green sheet 5 is obtained by molding a slurry containing a ceramic powder, a binder, a plasticizer and a solvent to a sheet by using a doctor blade process or the like. A plurality of ceramic green sheets 5 are prepared for lamination.

Figure 1B:
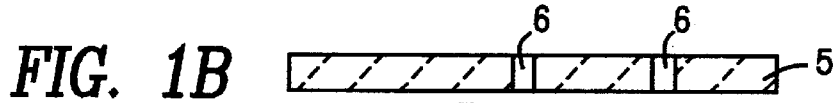

Next, as shown in FIG. 1B, through holes 6 for via conductors are provided in specified ceramic green sheets 5.

Figure 1C:
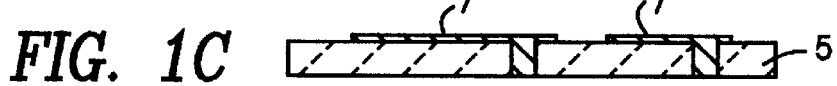

Next, as shown in FIG. 1C, a conductor paste 7 is provided on the specified ceramic green sheets 5 by screen printing or the like to form internal wiring conductors made of the conductor paste 7, and then dried. The provided conductive paste 7 forms internal conductor films 8 (refer to FIGS. 1F and 1G) in the specified ceramic green sheets 5, and fills the through holes 6 to form via hole conductors 9 (refer to FIGS. 1F and 1G) in the specified ceramic green sheets.

As is generally known, the conductive paste 7 comprises a conductive metal powder as a conductive component, a binder and a solvent. The conductive component preferably has as low resistance as possible in order to comply with an increase in the frequency of an electronic apparatus using the multilayered ceramic substrate 1. Therefore, a metal comprising silver or copper as a main component is advantageously used.

As the metal comprising silver as the main component, for example, silver, an Ag—Pd alloy, a Ag—Pt alloy and the like can be used. In the case of such a metal, the burning step described below is performed in air at a temperature of 850 to 950° C.

On the other hand, as the metal comprising copper as the main component, for example, CuO, $Cu_2O$, and the like can be used. In this case, the burning step described below is performed in nitrogen gas at a temperature of 930 to 1000° C. In the case of the metal comprising copper as the main component, a reducing atmosphere is applied during burning, and thus a copper oxide i.e., CuO or $Cu_2O$, is frequently used as the metal contained in the conductive paste 7.

In connection with the conductive component of the conductive paste 7, as the ceramic powder contained in the ceramic green sheets 5, it is preferable to use a ceramic powder comprising a low-temperature sintered ceramic material, which can be sintered at a temperature of about 1000° C. or less, for example, such as a glass-ceramic mixture containing 50% by weight each of alumina and glass, or a ceramic material which produces a glass component during burning, and is consequently sintered at low temperature, rather than a high-temperature sintered ceramic material such as $BaTiO_3$ or $Al_2O_3$, which sinters at 1300 to 1500° C.

Figure 1D:
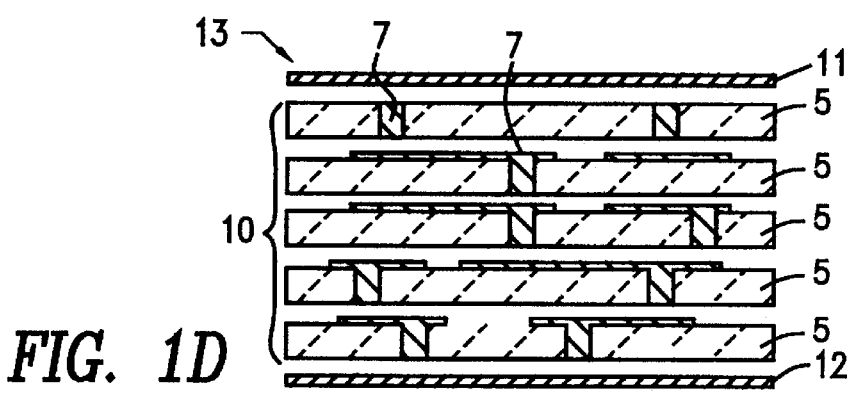

Next, as shown in FIG. 1D, the plurality of ceramic green sheets 5 on each of which the conductive paste 7 is coated in the desired form, are laminated in the predetermined order, and metallic foils 11 and 12 are arranged to cover both main surfaces of the green laminated structure 10 comprising the plurality of ceramic green sheets 5, and to hold the green laminated structure 10 therebetween in the direction of lamination, thereby obtaining a green composite laminated product 13. At this time, the entire main surfaces of the green laminated structure 10 are respectively preferably covered with the metal foils 11 and 12.

The metal which constitutes the metallic foils 11 and 12 preferably has a melting point higher than the sintering temperature of the ceramic contained in the ceramic green sheets 5. Where each of the ceramic green sheets 5 contains a low-temperature sintered ceramic material, which can be sintered at a temperature of about 100° C. or less, a copper foil having low resistance is preferably used as each of the metallic foils 11 and 12. Also, copper is preferred from the viewpoint that the problem of migration is minimized.

Figure 1E:
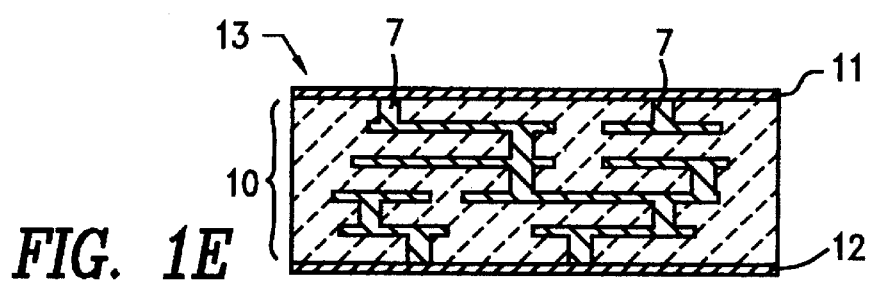

Next, the green composite laminated product 13 having a structure in which the green laminated structure 10 is held between the metallic foils 11 and 12 is pressed in the direction of lamination under heating to achieve close contact between the respective ceramic green sheets 5 and between the ceramic green sheets 5 and each of the metallic foils 11 and 12, as shown in FIG. 1E.

The surfaces of the metallic foils 11 and 12, which face the green laminated structure 10, are preferably roughened, thereby exhibiting a greater anchoring effect of the binder and the plasticizer contained in the ceramic green sheets 5, and increasing the adhesive strength therebetween. If required, an organic binder and/or a bond such as glass paste may be coated between each of the metallic foils 11 and 12 and the green laminated structure 10.

Figure 1F:
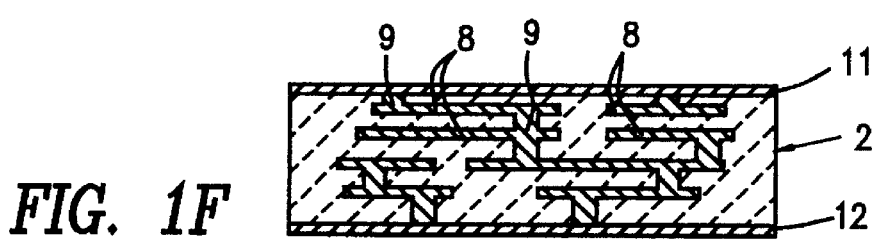

Next, the green composite laminated product 13 is subjected to the burning step. As a result, as shown in FIG. 1F, a sintered laminated structure 2 held between the metallic foils 11 and 12 is obtained.

In further detail, after the above burning step, the green laminated structure 10 becomes the sintered laminated structure 2 held between the metallic foils 11 and 12. The laminated structure 2 has a structure in which a plurality of ceramic layers derived from the ceramic green sheets 5 are laminated. The laminated structure 2 also has the internal conductor films 8 and the via hole conductors 9 formed therein and obtained burning the conductive paste 7. Some of the via hole conductors 9 are formed in contact with the metal foil 11 or 12.

In the burning step, the metallic foils 11 and 12 are neither sintered nor shrunk, and thus exert a constraining force to suppress shrinkage in the direction of the main surfaces on the ceramic green sheets 5 of the green laminated structure 10. In the burning step, organic components such as the binder and the plasticizer contained in the ceramic green sheets 5 and the conductive paste 7 are burned out, and the ceramic material contained in the ceramic green sheets 5 and the metal powder contained in the conductive paste 7 are sintered. However, the force of shrinkage due to sintering substantially occurs only in the direction of the thickness, with substantially no shrinkage force in the direction of the main surfaces of the ceramic green sheets 5.

Also, the metallic foils 11 and 12 are strongly bonded to the main surfaces of the sintered laminated structure 2 due to the anchor effect of the adhesive effect of the glass component contained in the ceramic green sheets 5, the glass component produced from the ceramic green sheets 5 or the glass component coated between the green laminated structure 10 and the metallic foils 11 and 12.

By using a metal comprising copper or silver as the main component as the conductive component contained in the conductive paste 7, and a copper foil as each of the metallic foils 11 and 12, a burning atmosphere comprising, for example, nitrogen gas can be applied to the burning step.

Figure 1G:
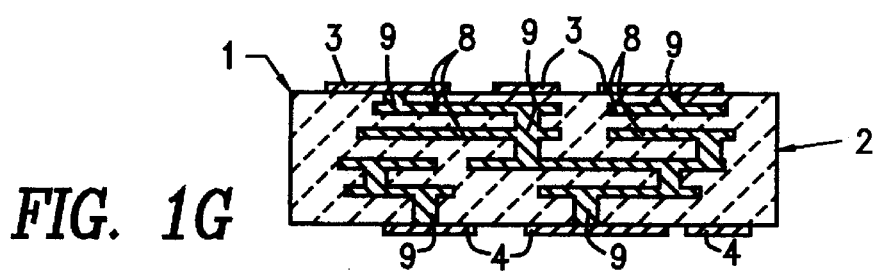

Next, as shown in FIG. 1G, the metallic foils 11 and 12 are subjected to each of the steps of resist coating, exposure and etching based on the photolithographic technology to obtain the external conductor films 3 and 4 patterned to the desired forms.

In this way, the multilayered ceramic substrate 1 having the appearance shown in FIG. 2 is completed.

The thus-obtained multilayered ceramic substrate 1 may be subjected to a plating step, a part mounting step, a sealing step, a casing step and/or terminal attaching step, etc. according to demand.

While the invention has been particularly shown and described with reference to preferred embodiments thereof, it will be understood by those skilled in the art that the forgoing and other changes in form and details may be made therein without departing from the spirit of the invention.

What is claimed is:

1. A method of producing a multilayered ceramic substrate comprising:

providing a green composite laminate comprising a plurality of stacked ceramic green sheets to be laminated and conductive paste for forming at least one internal wiring conductor in association with at least one of the ceramic green sheets, and having metallic foils arranged to cover both main surfaces of the green composite laminate comprising the plurality of ceramic green sheets and to hold the green composite laminate therebetween in the direction of lamination;

burning the green composite laminate at a temperature lower than the melting point of the metal which constitutes the metallic foils while the metallic foils are suppressing shrinkage in the direction parallel to the main surfaces; and patterning the metallic foils by photolithographic etching after the burning step.

2. The method of producing a multilayered ceramic substrate according to claim 1, wherein each of the ceramic green sheets comprises a low-temperature sintered ceramic material which can be sintered at a temperature of about 1000° C. or less, wherein the conductive paste comprises a metallic conductive component in which the metal is at least one of copper and silver, and wherein the burning step is performed at a temperature of about 1000° C. or less.

3. The method of producing a multilayered ceramic substrate according to claim 2, wherein each of the metallic foils comprises a copper foil.

4. The method of producing a multilayered ceramic substrate according to claim 3, wherein the conductive paste for forming the internal wiring conductor comprises a via hole conductor paste which is disposed so as to pass through at least one of ceramic green sheets and contact a metallic foil.

5. The method of producing a multilayered ceramic substrate according to claim 4, wherein the surfaces of the metallic foils which face the green laminated structure are roughened.

6. The method of producing a multilayered ceramic substrate according to claim 5, wherein the green composite laminate contains an organic binder or a glass paste or both between at least one of the metallic foils and the green laminate.

7. The method of producing a multilayered ceramic substrate according to claim 5, wherein the metal in the metallic conductive paste comprises copper.

8. The method of producing a multilayered ceramic substrate according to claim 5, wherein the metal in the metallic conductive paste comprises silver.

9. The method of producing a multilayered ceramic substrate according to claim 5, wherein the conductive paste is disposed at a plurality of locations within said green composite laminate.

10. The method of producing a multilayered ceramic substrate according to claim 1, wherein each of the metallic foils comprises a copper foil.

11. The method of producing a multilayered ceramic substrate according to claim 1, wherein the conductive paste for forming the internal wiring conductor comprises a via hole conductor paste which is disposed so as to pass through at least one of ceramic green sheets and contact a metallic foil.

12. The method of producing a multilayered ceramic substrate according to claim 1, wherein the surfaces of the metallic foils which face the green laminated structure are roughened.

13. The method of producing a multilayered ceramic substrate according to claim 1, wherein the green composite laminate contains an organic binder or a glass paste or both between at least one of the metallic foils and the green laminate.

14. The method of producing a multilayered ceramic substrate according to claim 13, wherein the metal in the metallic conductive paste comprises silver and the burning step is effected in air at a temperature of about 850 to 950° C.

15. The method of producing a multilayered ceramic substrate according to claim 1, wherein the conductive paste comprises a metallic conductive component in which the metal is at least one of copper and silver.

16. The method of producing a multilayered ceramic substrate according to claim 15, wherein the metal in the metallic conductive paste comprises copper and the burning step is effected in a reducing atmosphere at a temperature of about 930 to 1000° C.

17. The method of producing a multilayered ceramic substrate according to claim 1, wherein the conductive paste is disposed at a plurality of locations within said green composite laminate.

18. A multilayered ceramic substrate obtained by the method according to claim 9.

* * * * *